United States Patent [19]

Oda et al.

[11] 4,251,620
[45] Feb. 17, 1981

[54] LIGHT-SENSITIVE PRINTING PLATE PROCESS

[75] Inventors: Kazutaka Oda; Yoshio Okishi, both of Kawajiri Yoshida, Japan

[73] Assignee: Fuji Photo Film Co., Ltd., Minami-ashigara, Japan

[21] Appl. No.: 88,916

[22] Filed: Oct. 29, 1979

Related U.S. Application Data

[60] Division of Ser. No. 878,355, Feb. 16, 1978, which is a continuation of Ser. No. 659,447, Feb. 19, 1976, abandoned.

[30] Foreign Application Priority Data

Mar. 24, 1975 [JP] Japan .................................. 50-35940
Feb. 19, 1978 [JP] Japan .................................. 53-20320

[51] Int. Cl.³ ............................ G03F 7/02; G03C 1/72
[52] U.S. Cl. .................................... 430/300; 430/302; 430/307; 430/306
[58] Field of Search ............... 430/302, 308, 396, 306, 430/496, 523, 531, 539, 935, 950, 300, 307

[56] References Cited

U.S. PATENT DOCUMENTS 3,897,251  7/1975  Detrick ............................ 430/396

Primary Examiner—Sam Silverberg
Attorney, Agent, or Firm—Sughrue, Rothwell, Mion, Zinn and Macpeak

[57] ABSTRACT

A light-sensitive printing plate with a coating layer with an uneven pattern removable during development provided on the surface thereof, which can be brought into intimate contact with an original image in a short period of time by vacuum adhesion. The light-sensitive printing plate is produced by taking up a coating solution from a coating solution pan by a gravure roll, scraping away excess coating solution adhering to the gravure roll by a doctor blade, transferring the coating solution still retained on the gravure roll to a coating roll made of rubber with a fine uneven pattern on the surface thereof which is turning in the same direction and at the same speed as the gravure roll, and transferring the coating solution thus transferred to the coating roll to a support running at the same speed and in the same direction as the coating roll.

8 Claims, 10 Drawing Figures

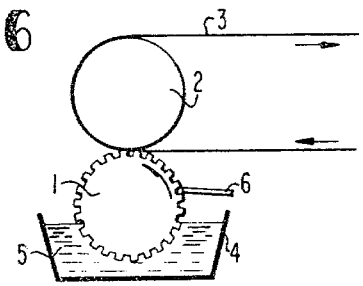
FIG 6
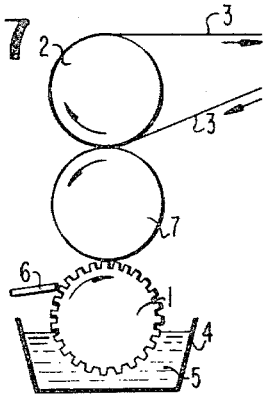
FIG 7
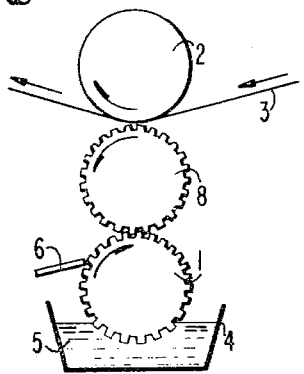
FIG 8
FIG 9
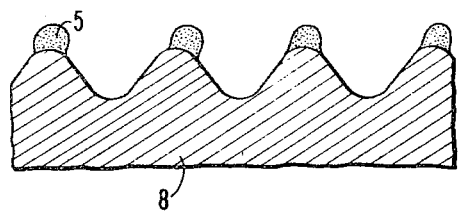
FIG 10
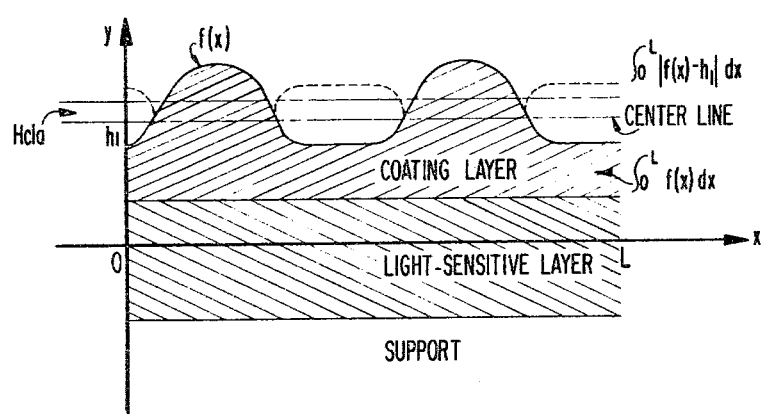

LIGHT-SENSITIVE PRINTING PLATE PROCESS

This application is a Divisional Application of Ser. No. 878,355, filed Feb. 16, 1978, in turn a Continuation Application of Ser. No. 659,447, filed Feb. 19, 1976, now abandoned.

BACKGROUND OF THE INVENTION

1. Field of the Invention

The present invention relates to a light-sensitive printing plate and to a process for the production of the same. More particularly, the present invention is concerned with a light-sensitive printing plate carrying an uneven coating layer on the surface thereof, and a process for the production of the same.

2. Description of the Prior Art

When a light-sensitive printing plate is exposed to light through an original, the light-sensitive printing plate and the original have hitherto been interposed between a rubber sheet and a pressure glass, and the clearance between the rubber sheet and the pressure glass has been evacuated so that the original comes into intimate contact with the surface of a light-sensitive layer of the light-sensitive printing plate, or in the case that a resin layer is provided on the light-sensitive layer of the light-sensitive printing plate, into intimate contact with the surface of the resin layer (hereinafter both are merely referred to as "the surface of a light-sensitive printing plate"). This method is hereinafter called "a vacuum adhesion method".

However, since conventional light-sensitive printing plates have smooth surfaces, when an original is brought into intimate contact with a light-sensitive printing plate by the vacuum adhesion method, adhesion is gradually achieved by suction from the edge of the original, and extremely long periods of time have been required for the original to be brought in complete intimate contact with the whole surface of the light-sensitive printing plate. The fact that a long period of time is required for adhesion reduces the efficiency of plate-making operations and is very uneconomical. Moreover, if image-wise exposure is applied when adhesion is incomplete, a sharp image cannot be obtained at the areas where adhesion is incomplete, and sharp prints cannot be obtained. Thus, shortening the time required for adhesion has been an important object of the art.

SUMMARY OF THE INVENTION

The objects of the present invention are to provide a light-sensitive printing plate capable of shortening the adhesion step in the vacuum adhesion method, and to provide a process for producing such a light-sensitive printing plate.

It has now been found that the above objects can be attained by providing on the surface of a light-sensitive printing plate a coating layer which is removable during the step of development in such a manner that a fine pattern, in which coated areas and uncoated areas exist, is formed.

If a coating layer comprising a fine pattern in which coated areas and uncoated areas exist is provided on the surface of a light-sensitive printing plate, when an original is brought into intimate contact with the surface of the light-sensitive printing plate suction is uniformly effected, and it is possible to bring the original into complete intimate contact with the whole surface of the light-sensitive printing plate in a short period of time.

BRIEF DESCRIPTION OF THE DRAWINGS

FIGS. 6 and 7 schematically show a gravure coating apparatus and a gravure offset coating apparatus, respectively.

FIG. 8 schematically shows a coating apparatus for use in effecting an embodiment of a coating method in accordance with the present invention.

FIG. 9 schematically shows the state of a coating solution attached to a coating roll in a coating method in accordance with of the present invention.

FIG. 10 is a schematic representation of a light-sensitive printing plate carrying thereon a coating layer with a pattern in accordance with the present invention having the various parameters utilized to define Hcla values thereon, as explained in the specification.

DETAILED DESCRIPTION OF THE INVENTION

According to the present invention, a coating layer is provided on the surface of a light-sensitive printing plate in such a manner that a pattern in which coated areas and uncoated areas exist is formed. Thus, it is possible to bring an original into complete intimate contact with the whole surface of the light-sensitive printing plate.

Furthermore, if such a coating layer is provided, light-sensitive layers are free from damage even though light-sensitive printing plates are superposed, and light-sensitive printing plates adjacent to each other do not adhere to each other, thereby enabling one to handle them with ease.

Figure 1:
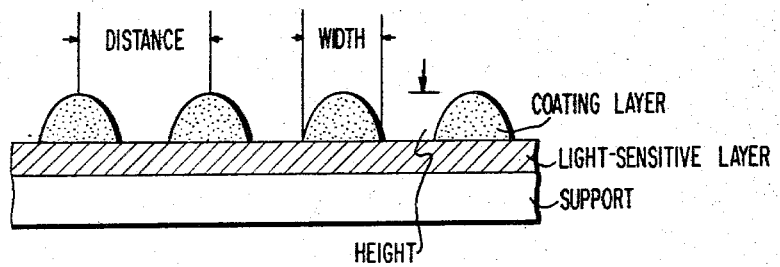
FIG. 1 is a sectional view of a light sensitive printing plate carrying a coating layer with a pattern in accordance with the present invention.
Figure 2:
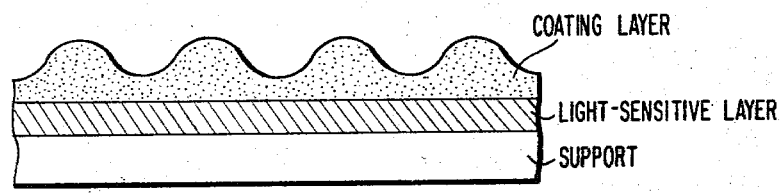
FIG. 2 is a sectional view of a light sensitive printing plate carry a coating layer with another pattern in accordance with the present invention.

A light-sensitive printing plate with a coating layer having a fine pattern in which coated areas and uncoated areas exist on the surface thereof has excellent properties, e.g., good developing properties as compared with a light-sensitive printing plate with an uneven coating layer which merely differs in coating thickness provided on the surface thereof. A cross sectional view of the former light-sensitive printing plate is shown in FIG. 1, and of the latter light-sensitive printing plate in FIG. 2. It is easily seen from a review of FIGS. 1 and 2 that the main difference between the embodiment of FIG. 1 and embodiment of FIG. 2 is as is described above, i.e., in the embodiment of FIG. 1 the coated and uncoated areas are discontinuous whereas in the embodiment of FIG. 2 the "coated areas" are areas of greater coating height than the "uncoated" areas. Either light-sensitive printing plate, however, is markedly improved in adhesive properties as compared with conventional light-sensitive printing plates, and it is possible to eliminate the delay in adhesion at the central portion thereof and to achieve uniform and complete adhesion in a short period of time.

In the present invention, both of the above described two coating layers are hereinafter, including in the appended claims, called "coating layers comprising uneven patterns".

Light-sensitive printing plates on the surface of which is provided a coating layer according to the present invention fundamentally comprise a support and one or more light-sensitive layers provided on the support. Therefore, the light-sensitive printing plates include plates for producing printing plates such as lithographic printing plates, letter printing plates, intaglio printing plates and the like.

The supports which can be used in the present invention include dimensionally stable plates as are conventionally used as supports for printing members. Such supports, but are not limited to paper, plastic (e.g., polyethylene, polypropylene, polystyrene or the like) laminated paper, metal plates, e.g., aluminum (including aluminum alloys, e.g., Al-Mn, Al-Cu, Al-Mg-Cr, Al-Mg-Cr-Mn, Al-Mg-Mn, Al-Mg-Si, Al-Mg-Cr-Si, Al-Si, Al-Si-Ni-Mg-Cu, etc.), zinc, iron, copper and the like, plastic films, e.g., cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinyl acetal, and the like, the above paper or plastic films having a metal as described above laminated or vapor-deposited thereon, etc.

A suitable support is selected from supports as above described, depending on the type of printing plate. For instance, in the case of a light-sensitive lithographic printing plate, an aluminum plate, a composite sheet as described in Japanese Patent Publication 18327/1973 in which an aluminum sheet is bonded to a polyethylene terephthalate film and the like are preferably used. In the case of a light-sensitive letter printing plate, a polyethylene terephthalate film, an aluminum plate, an iron plate and the like are preferably used.

The support can be, as necessary, subjected to a surface treatment. For instance, in the case of a light-sensitive lithographic printing plate, the surface of the support is rendered hydrophilic, with various methods being useful. For instance, in the case of a support carrying a plastic surface, surface processing methods such as chemical treatment, discharge treatment, flame treatment, ultraviolet ray treatment, high frequency treatment, glow discharge treatment, active plasma treatment, laser treatment or the like, as described in U.S. Pat. Nos. 2,764,520, 3,497,407, 3,145,242, 3,376,208, 3,072,483, 3,475,193, 3,360,448, British Pat. No. 788,365, etc., can be used. Furthermore, a method in which an undercoating layer, e.g., as described in U.S. Pat. No. 3,511,661, 3,860,426 and Japanese Patent Applications 83902/73 and 102403/74 for mainly undercoating on a metallic support is coated on the surface after the above surface treatment can be used.

In the case of supports having a metal, in particular, an aluminum surface, it is preferred that a surface treatment such as sand-graining as described in U.S. Pat. No. 2,882,154, dipping in an aqueous solution of sodium silicate as described in U.S. Pat. No. 2,882,153, potassium fluorozirconate, phosphates or the like, anodic oxidation or the like be applied. Moreover, an aluminum plate dipped in an aqueous solution of sodium silicate after sand-graining as described in U.S. Pat. No. 2,714,066 and an aluminum plate dipped in an aqueous solution of an alkali metal silicate after anodic oxidation as described in U.S. Pat. No. 3,181,461 can be suitably be used in the present invention.

The above anodic oxidation is carried out by flowing electricity in an electrolyte consisting of one or more of aqueous solutions of inorganic acids such as phosphoric acid, chromic acid, sulfuric acid, boric acid, and the like, organic acids such as oxalic acid, sulfamic acid, and the like, or the salts thereof, with an aluminum plate as anode, e.g., using direct current at a current density of 1 to 2 A/dm$^2$ and a voltage of 10 to 20 V in a 10 to 20% aqueous solution of sulfuric acid at 20° to 30° C.

Furthermore, silicate electrodeposition as described in U.S. Pat. No. 3,658,662 can be effectively used.

These treatments are applied, in addition to rendering the surface of the support hydrophilic, to prevent harmful reactions between the support and a light-sensitive composition provided thereon, or to increase adhesion between the support and the light-sensitive layer.

Any light-sensitive material can be provided on the support so long as it shows changed solubility or swelling properties in a developer before and after exposure. Phrased somewhat differently, the object of the present invention is to provide a light sensitive printing plate having thereon a coating layer, so that the time required for contacting in processing can be shortened by vacuum adhesion. Accordingly, the light sensitive compositives which can be used in the present invention are exactly the same as those conventionally used, and can be either nega-posi type or posi-nega type light sensitive materials. Here, the nega-posi type light sensitive material is hardened by a cross-linking reaction at exposed areas and forms, an image upon development while the light-sensitive material at unexposed area is removed, such as diazide resins, diazide resins and a binder, azide light-sensitive materials and other light-sensitive resins etc. A posi-nega type light-sensitive material is decomposed at exposed areas to form an alkali-soluble group therein, and then developed to remove the exposed areas to form an image at unexposed areas, such as o-diazidooxide type light-sensitive material.

Particularly preferred light-sensitive materials are a light-sensitive composition comprising a diazo resin and shellac (see Japanese Patent Appln. (OPI) 24404.1972), poly(hydroxyethyl methacrylate) and a diazo resin, a diazo resin and a soluble polyamide resin (see U.S. Pat. No. 3,751,257), an azide light-sensitive material and an epoxy resin (see U.S. Pat. No. 2,852,379), an azide light-sensitive material (see British Pat. No. 1,071,560), a diazo resin (see U.S. Pat. No. 3,168,401), and the like; those light-sensitive resins containing unsaturated double bonds in their molecules and undergoing a dimerization reaction upon irradiation with active rays, thereby becoming insoluble, as exemplified by polyvinyl cinnamate, polyvinyl cinnamate derivatives as described in British Pat. Nos. 843,545 and 966,297 and U.S. Pat. No. 2,725,372; light-sensitive polyesters produced by the condensation of bisphenol A and divanillalcyclohexanone or of p-phenylenediethoxy acrylate and 1,4-di-$\beta$-hydroxyethoxy cyclohexanone as described in Canadian Pat. No. 696,372; prepolymers of diallyl phthalate as described in U.S. Pat. No. 3,462,267; ethylene based unsaturated compounds containing at least two unsaturated double bonds in their molecules which undergo a polymerization reaction upon irradiation with active rays, such as unsaturated esters of polyols as described in Japanese Pat. Publication No. 8495/1960, e.g., ethylene di(meth)acrylate, diethyleneglycol di(meth)acrylate, glycerol di(meth)acrylate, glycerol tri(meth)acrylate, ethylene dimethacrylate, 1,3-propylene di(meth)acrylate, 1,4-cyclohexane diol (meth)acrylate, 1,4-benzenediol di(meth)acrylate, pentaerythritol tetra(meth)acrylate, 1,3-propyleneglycol di(meth)acrylate, 1,5-pentanediol di(meth)acrylate, pentaerythritol tri(meth)acrylate, the bisacrylates and methacrylates of polyethylene glycol having a molecular weight of about 50 to about 500, unsaturated amides, particularly amides of α-methylenecarboxylic acid; α,ω-diamines and ω-diamines with oxygen interposed therebetween, such as methylenebis(meth)acrylamide and diethylene triamine tris(meth)acrylamide; divinyl succinate, divinyl adipate, divinyl phthalate, divinyl phthalate, divinyl benzene-1,3-disulfonate, and the like.

Light-sensitive compositions comprising the above materials and one or more suitable binders, preferably having a molecular weight greater than about 10,000, such as polyvinyl alcohol, cellulose derivatives containing a carboxyl group in a side chain, e.g., polyvinyl hydrogen phthalate, carboxymethyl cellulose, or a copolymer of methyl methacrylate and methacrylic acid (methyl methacrylate: methacrylic acid proportions=90:10 (molar)), etc., can be effectively used as negative working type light-sensitive compositions which become insoluble by action of active rays.

Those light-sensitive compositions comprising o-diazooxide based light-sensitive materials as described in U.S. Pat. Nos. 3,635,709, 3,061,430, and 3,061,120, phosphotungstate of a diazo resin (see Japanese Patent Publication No. 7663/1964), hexacyanoferrates of a diazo resin (see U.S. Pat. No. 3,113,023), and a diazo resin and polyvinyl hydrogen phthalate (see Japanese Patent Application 18812/1965), etc., can be effectively used as positive working type light-sensitive compositions.

In addition, those light-sensitive compositions containing linear polyamides and monomers containing therein addition polymerizable unsaturated bonds, as described in U.S. Pat. Nos. 3,081,168, 3,486,903, 3,512,971, and 3,615,629 are useful.

Light-sensitive printing plates which can be used in the present invention fundamentally comprise a support and a light-sensitive layer consisting of one or more of the above light-sensitive materials provided on the support. The thickness of the light-sensitive layer in accordance with this invention is not limited in any particular fashion, but for most commercial embodiments. The light-sensitive layer is accordance with the present invention will be used at a dry thickness of about 0.1 to about 7 g/m², more preferably 0.2 to 5 g/m². In addition, printing plates in which a resin layer is further provided on the above light-sensitive layer, can be used. In more detail, light-sensitive printing plates as described in Japanese Patent Publication No. 11558/1962 can be used wherein a light-sensitive layer and a hydrophobic, water-insoluble and solvent-softenable resin layer are provided on the support in this order (such plates do not, of couse, have the uneven coating layer of this invention).

When such light-sensitive printing plate is exposed to light through an original, exposed areas of the light-sensitive layer are rendered insoluble in a developer, and, at the same time, they are bonded to the resin layer thereon, whereas unexposed areas of the light-sensitive layer remain unchanged and are soluble in the developer. Therefore, when the light-sensitive printing plate is developed, unexposed areas of the light-sensitive layer are dissolved in and removed by the developer permeating through the resin layer thereon. Consequently, when the surface of the light-sensitive printing plate is gently rubbed with cotton impregnated with the developer, the resin layer at the unexposed areas is removed. However, exposed areas of the light-sensitive layer, and the resin layer thereon, remain on the support without being influenced by the developer at all, and thus a printing plate with a tightly adherant image can be obtained.

The coating layer of the present invention is provided on the surface of the light-sensitive printing plate in such a manner that the coating layer has the following surface coarseness. That is, the height of any coating area is preferably about 2 to about 40μ, particularly 5 to 20μ; the width is preferably about 20 to about 10,000μ, particularly 50 to 50,000μ; the distance between adjacent coating areas is preferably about 50 to about 100,000μ, particularly 100 to 50,000μ, and the surface coarseness as indicated by Hcla (center line surface coarseness) is preferably about 0.05 to about 20μ, particularly about 0.1 to 10μ. If the surface coarseness is less than about 0.05μ, the effect that the time required for adhering by vacuum adhesion is shortened is reduced, whereas if the surface coarseness is more than about 20μ, the adhesion between the light-sensitive printing plate and the original becomes incomplete and image sharpness is reduced. In the embodiment of FIG. 1, the height of any coating area and the Hcla values are measured, of course, with reference to the height of the coating layer from the light-sensitive layer base; on the other hand, with an embodiment as is shown in FIG. 2 the height of any coating area and the Hcla values are measured from the top of the only slightly coated area (valley) to the top of the highly coated area (mountain). If reference is made to FIG. 1, the height, distance and width of any coated area are exemplified thereon.

$$\text{Herein, Hcla} = \frac{1}{L} \int_O^L |f(x) - h_1| dx$$

wherein f(x) represents the cross-sectional surface coarssness (or roughness) of the printing plate as identified in FIG. 10, L is the length along the x axis as shown in FIG. 10, $h_1$ is
the value of y at the point of intersection of the y axis with the center line as shown in FIG. 10, which can be given by the formula $$h_1 = \frac{1}{L} \int_O^L f(x) dx$$

and dx is the differential increase along the x axis. See Hyomen Arasa Sokuteiki NDC 532.8 (Measure of Surface Coarseness) Kojyo Sokuteiki Koza 12, NIkkan Kogyo Shinbunsha.

As one skilled in the art will appreciate, while the above formulae are given for the embodiment of FIG. 1, the Hcla parameter can be calculated for other embodiments in a similar fashion.

Any coating solution can be coated on the surface of the light-sensitive printing plate provided that it exerts no harmful physical or chemical influence on the light-sensitive material constituting the light-sensitive layer, can be removed with ease during development, and undergoes no reaction with the developer used. In more detail, those solutions can be used which are prepared by dissolving gum arabic, glue, gelatin, casein, cellulose, e.g., sodium cellulose xanthate, methyl cellulose, ethyl cellulose, hydroxyethyl cellulose, hydroxypropylmethyl cellulose, carboxymethyl cellulose, and the like, starch, e.g., soluble starch, modified starch, e.g., enzyme-modified starch, and the like, resins, e.g., polyvinyl alcohol, polyethylene oxide, polyacrylic acid, polyacrylamide, polyvinyl methyl ether, an epoxy resin, e.g., the reaction product of bisphenol A and epichlorohydrin, a phenol resin (in particular, a novolak type phenol resin is preferred, i.e., a phenol resin produced by the reaction of 1 mole of phenol (e.g., phenol, cresol, resorcinal, etc.) with less than 1 mole of formaldehyde by acidic condensation), a polyamide (polyamides soluble in alcohols containing 1 to 6 carbon atoms such as methanol, ethanol, isopropanol, butanol, t-butanol, amyl alcohol, hexanol, and the like are preferred, e.g., commercially available nylons), polyvinyl butyral, and the like, in appropriate solvents, e.g., carbon tetrachloride, benzene, etc. Alcohols are not used because they dissolve the light sensitive layer. These resins can be used in combination with each other.

These coating solutions may contain conventional matting agents. These matting agents include silicon dioxide, zinc oxide, titanium oxide, zirconium oxide, glass beads, alumina, starch, polymer particles, e.g., polymethyl methacrylate, polystryene, a phenol resin, e.g., novolak type phenol resin, and the like, and matting agents as described in U.S. Pat. Nos. 2,701,245 and 2,992,101. These matting agents can be used alone or in combination with each other. However, since the surface coarseness of the coating layer is subject to the above described limitations, the particle diameter of the matting agent is preferably about 3 to about 30$\mu$, particularly about 6 to 20$\mu$.

When used, the amount of the matting agent added is suitably about 0.05 to about 2 parts by weight, preferably 0.3 to 2 parts by weight per part by weight of the binder(s) in the coating solution. The matting agent is usually incorporated in the coating layer by dispersing the matting agent in a solution of the resin selected as the binder for the matting agent in a solvent, and by coating the resulting dispersion on the surface of the light-sensitive printing plate. The above solvent is selected from those solvents which are poor solvents for the matting agent, good solvents for the resin in which the matting agent is to be dispersed, and which do not materially dissolve the surface of the light-sensitive printing plate. Such a solvent can be easily selected by one skilled in the art once the surface of the light-sensitive printing plate, the matting agent, and the resin are determined.

As methods of providing a coating layer with an uneven pattern by coating a coating solution on the surface of a light-sensitive printing plate, a gravure coating method is first illustrated. FIG. 6 shows a gravure coating apparatus. In the gravure coating method, since a gravure roll usually has a fine uneven pattern on the surface thereon, it is possible to provide a coating layer with the same uneven pattern as that emnbossed on the surface of the gravure roll. In FIG. 6, gravure roll 1 and back-up roll 2 are rotated in the same direction as that of a long flexible support 3 which has a light-sensitive layer or, additionally, a resin layer provided on the surface thereof (hereinafter referred to as a "web"). The gravure roll 1 is made of metal, and its surface is embossed with a pattern of the oblique line type, the pyramid type, or the like and thus it is finely uneven. The size of the uneven pattern is usually about 30 to about 200 mesh. The back-up roll 2 is usually made of an elastic material such as rubber. A coating solution 5 which attaches to the surface of the gravure roll 1 and which is taken up out of a coating solution pan 4 by the rotation of the gravure roll 1, is mostly scraped off by a doctor blade 6 (provided in such a manner that it is pressed onto the gravure roll 1) and returned to the coating solution pan 4. On the other hand, coating solution 5 not scraped off is retained only in the concave cell portions of the uneven pattern of the gravure roll 1. When the gravure roll 1 rotates and comes into contact with the web 3, coating solution 5 is transferred to the web 3. In this case, since the web 3 is strongly pressed onto the gravure roll 1 by the back-up roll 2, about 30 to about 50% of the coating solution 5 retained in the concave cells is usually transferred. In this way, a coating layer with the same uneven pattern as the surface pattern of the gravure roll 1 is provided on the web 3.

The coating amount in the undried state is determined by the ratio of the amount of the coating solution transferred to the web 3 to the amount of the coating solution retained in the concave cells of the gravure roll 1 per unit area, e.g., in ml/m$^2$ (this ratio is hereafter referred to as the "transfer ratio"). The amount of the coating solution retained in the concave cells is determined by the shape and dimension of the pattern embossed on the surface of the gravure roll 1, and the transfer ratio is determined by the coating speed, the physical properties of the coating solution, the properties of the surface of the web 3, etc. As will be appreciated by one skilled in the art, the present invention can be applied to many different types of light sensitive printing plates, for example, planographic, letter and intaglio printing plates. Accordingly, one merely selects a conventional web which is suitable for the type of printing plate desired. The general rule is that as the coating speed increases, the transfer ratio somewhat slightly increases and the coating solution transferred to the web will be spread when the surface tension of the web (i.e., the surface tension of the light-sensitive layer on the support) is higher. Given this general explanation of the factors involved, one skilled in the art will easily be able to balance the above parameters to obtained a product of optium quality. Therefore, if the coating solution 5 is retained only in the concave cells, the coating amount is completely determined by predetermined operation conditions. Accordingly, in gravure coating it is important that excess coating solution attached to the surface of the gravure roll 1 be scraped off and the coating solution retained only in the concave cells.

For this reason, in general, a method is used in which a blade-like metal plate made of firm stainless steel is used and the blade-like metal plate is pressed onto the gravure roll 1 at a pressure of about 50 to about 200 Kg/m. In this method, however, problems occur in that both the gravure roll 1 and the doctor blade 6 are worn away, and since abrasion of the gravure roll 1 undesirably has a direct influence on the coating amount and the uneven pattern of the coating layer, hard chromium plating is usually applied to the surface of the gravure roll 1. However, when the abrasion of the gravure roll 1 is prevented by the above method, the doctor blade 6 is worn away, thereby producing uneven coating. On the othe hand, where excess coating solution is insufficiently scraped off by the doctor blade 6, coating solution 5 is not retained only in the concave cells, thereby forming a thin film of the coating solution on the surface of the gravure roll 1. Thus, between the gravure roll 1 and the web 3 there is formed a so-called bead, as a result of which coating solution 5 is coated on the surface of the web 3, and a coating layer with the same uneven pattern as the surface pattern of the gravure roll 1 cannot be obtained.

It is quite difficult, however, to use such a gravure coating method in forming the coating layer with the uneven pattern of the present invention. The reasons for this are as follows: first, since the gravure roll 1 is made of metal to prevent abrasion, there is the danger of the light-sensitive layer being damaged in the case that the coating layer is further provided on the light-sensitive layer according to the present invention; second, if excess coating solution is insufficiently scraped off by the doctor blade 6, a coating layer with an uneven pattern cannot be obtained, and, third, if excess coating solution is sufficiently scraped off, the doctor blade 6 is worn away, thereby producing uneven coating.

Next, it was considered to use a gravure offset coating method as the method of obtaining a coating layer with the uneven pattern of the present invention. FIG. 7 schematically shows a gravure offset coating apparatus.

In the gravure offset coating method, coating solution 5 in the coating solution pan 4 is taken out of the pan 4 by the gravure roll 1 in a state such that the coating solution is attached to the surface of the gravure roll 1, and most of the coating solution taken out is scraped off by the doctor blade 6. After passing under the doctor blade 6, the coating solution 5 is retained only in the concave cells of the gravure roll 1 and transferred to the surface of a coating roll 7 at the contact point between the gravure roll 1 and the coating roll 7 which has a smooth surface. In this case, the transfer ratio is usually about 30 to about 50%. Since coating roll 7 is generally made of rubber and placed in kiss-impression under fixed pressure at the contact point between the coating roll 7 and the gravure roll 1, a coating layer with the same uneven pattern as that on the surface of the gravure roll 1 is formed on the surface of the coating roll 7. The coating solution 5 transferred to the surface of the coating roll 7 is then further transferred to the web 3. However, since web 3 is pressed against the coating roll 7 under a certain pressure by the back-up roll 2 (usually made of rubber) at the zone where the coating solution is transferred to the web 3, and the surface of the coating roll 7 is smooth, the uneven pattern of the coating solution 5 formed on the surface of the coating roll 7 is essentially crushed and is lost as the coating solution is spread in the direction of the width of the web 3. Thus a coating layer with an uneven pattern cannot be provided on the web 3. In general, no coating layer with an uneven pattern can be formed by the offset gravure coating method.

Certain coating solutions, however, have a viscosity of several ten thousand poise, such as printing ink for offset printing, do not spread in the direction of the width of the web 3 at the time of transfer because of their low fluidity, and thus a coating layer with an uneven pattern can sometimes be formed. However, since the viscosity of the coating solution constituting the coating layer to be provided on the surface of the light-sensitive printing plate according to the present invention is usually about 1 to about 20,000 cps, preferably 5 to 10,000 cps, it is impossible to obtain a coating layer with an uneven pattern by gravure offset coating.

It has now been found that a coating layer with the desired uneven pattern can be provided on the surface of a light-sensitive printing plate by the following coating method.

According to the present invention, a coating solution is attached to the surface of a gravure roll and is taken up out of a coating solution pan, excess coating solution is scraped off by a doctor blade, the coating solution attached to the gravure roll is transferred to the surface of a coating roll made of an elastic material, e.g., rubber, which is elastic and has a fine uneven pattern larger than the gravure roll on the surface thereof, and the coating solution transferred to the surface of the coating roll is transferred to a web nipped under a fixed pressure by a back-up roll made of metal or rubber and having a smooth surface.

As indicated above, the coating roll material should be elastic. Coating roll materials which are preferably used are those having a hardness less than about 80° as measured with the spring type hardness measurement device improved Shore hardness defined in Japanese Industrial Standard (JISK 6301-1971, with measurement device).

The uneven pattern embossed on the surface of the coating roll may be of numerous types. It should be noted, in this regard, that any pattern comprising an uneven surface can be used, and the patterns involved are not limited to regular or repeating patterns, but a pattern which repeats in a regular fashion is preferred for use in the present invention.

All of those various patterns generally usable as the surface pattern of the gravure roll can be used provided that they are fine uneven patterns with regularity. The size of the surface pattern of the coating roll is required to be larger than that of the gravure roll. In general, the uneven pattern embossed on the surface of the gravure roll is about 30 to about 200 mesh, whereas the surface pattern of the coating roll is about 10 to about 60 mesh. The size of the uneven pattern of the gravure roll exerts a large influence on the coating amount, and that of the coating roll determines the pattern of the coating layer. In general, good coating is achieved when (mesh of coating roll)/(mesh of gravure roll)<2.

The nip pressure between the gravure roll and the coating roll is usually about 10 to about 200 Kg/m, preferably 100 to 200 Kg/m, and that between the coating roll and the back-up roll is usually about 1 to about 20 Kg/m, preferably 1 to 10 Kg/m.

The coating method of the present invention will now be explained in more detail by reference to the accompanying drawings although this coating method is illustrative and is not intended to limit the present invention.

FIG. 8 schematically shows a coating apparatus for use in effecting an embodiment of the coating method of the present invention.

The coating solution 5 attaches to the surface of the gravure roll 1 and is taken up out of the coating solution pan 4. The coating solution 5 taken up is mostly scraped away by the doctor blade 6 and recovered in the coating solution pan. The doctor blade 6 is pressed on the gravure roll 1 by an air cylinder (not shown), etc. This pressure is generally set at about 50 to about 100 Kg/m, preferably 100 to 150 Kg/m. After passing under the doctor blade 6, the coating solution 5 is retained only in the concave cells of the gravure roll 1. The coating solution 5 retained on the surface of the gravure roll 1 is brought into contact with the coating roll 8 turning in the same direction and at the same speed as the gravure roll 1 and having the uneven pattern on the surface thereof, and is transferred thereto. The transfer ratio from the gravure roll 1 to the coating roll 8 is usually about 30 to about 50%. The uneven pattern is embossed on the surface of the coating roll 8 and the coating solution transferred is retained at the upper portion of the convex embossment as shown in FIG. 9, which is a schematic representation of the state of the coating solution 5 transferred onto the surface of the coating roll 8. The speeds of the web, the coating roll and the gravure roll are the same, i.e., generally about 10 to about 200 m/min, if they are not the same, the surface of the coating roll will be deformed since the material of the coating roll is rubber. Since the surface pattern of the coating roll 8 is large in size as compared with that of the gravure roll 1 the coating solution is substantially uniformly transferred to the required portions of the surface of the coating roll 8. The coating roll 8 then comes into contact with the web 3, and the coating solution 5 retained on the surface of the coating roll is transferred to the web 3, thereby forming the coating layer. In this case, the transfer ratio is usually about 20 to about 50%. The web 3 moves in the same direction as the direction of rotation of the coating roll 8, and is pressed to the coating roll 8 by the back-up roll 2 made of metal or rubber and having a smooth surface. Since the coating solution on the surface of the coating roll 8 is, as described above, retained at the edge of the convex portions, a coating layer with the uneven pattern is formed on the web 3 as in gravure coating. Since the coating roll 8 is, as described above, made of elastic rubber, even in the case that the coating solution 5 is coated on the light-sensitive layer of the light-sensitive printing plate of the present invention, the light-sensitive layer is free from any deterioration.

Furthermore, even in the case that the coating solution 5 on the surface of the gravure roll is insufficiently scraped away by the doctor blade 6 and thus a thin film of the coating solution 5 is formed on the surface of the gravure roll 1, the coating solution transferred is still retained at the edge of the convex portions of the coating roll 8 so long as the coating solution is not transferred from the gravure roll 1 to the coating roll 8 in such an amount as to lose the uneven pattern on the surface of the coating roll 8, and thus a coating layer with the same uneven pattern as the surface pattern of the coating roll 8 is formed on the web 3. This means that the gravure roll 1 functions only as a so-called applicator. Therefore, since it is sufficient only to measure the amount of the coating solution to be attached to the surface of the gravure roll 1, and it is not necessary to retain the coating solution only in the concave cells as in the case of gravure coating, the doctor blade 6 is not necessarily required to be pressed to the gravure roll 1 at high pressure as in the case of gravure coating, and the requirements for this scraping (hereinafter referred to as "doctoring") are quite mild as compared with gravure coating. Therefore, the doctor blade 6 can be made of polytetrafluoroethylene, polyethylene, or the like, as well as stainless steel, and there is no fear of uneven coating being caused due to the abrasion of the doctor blade 6. The use of the gravure roll 1 as an applicator roll enables one, firstly, to increase the accuracy of supplying the coating solution to the coating roll 8, and, secondly, even in the case that the coating solution contains matting particles, makes it possible to supply the coating solution to the coating roll 8 without breaking the matting particles.

In the present invention, the amount of the coating solution coated on the surface of the light-sensitive printing plate is suitably about 0.05 to about 2 g/m$^2$, preferably 0.08 to 1 g/m$^2$, dry weight after drying. Where the amount is below the lower limit, the vacuum adhesion effect is insufficient, and where the amount is above the upper limit, problems take place in that drying time is unecessarily increased, larger apparatus is required, etc.

Since whether the uneven pattern is provided in the structure shown in FIG. 1 or in that shown in FIG. 2, greatly depends not only on the coating amount but the physical properties of the coating solution, such as surface tension, it is difficult to unequivocally state what conditions are required to form the above structure. In general, as a surface tension of the coating solution is increased, the coating solution is transferred in lesser amount to the coating roll (the elastic roll), while, on the other hand, as the surface tension of the coating solution is lowered relatively greater amounts of coating solutions are spread onto the coating mill. Obviously, however, the effect of the surface tension of the coating solution on transferring various depending upon the viscosity of the coating solution. In general, however, where the coating amount is below about 0.6 g/m$^2$, the uneven pattern shown in FIG. 1 is often obtained, whereas where the amount is above about 0.6 g/m$^2$, the uneven pattern shown in FIG. 2 is often obtained.

In the present invention, however, since the coating amount can be controlled with ease by controlling the pressure of the doctor blade, it is easy to selectively obtain the uneven patterns shown in FIGS. 1 and 2.

It goes without saying that the coating method of the present invention is not limited to the above described one, and a method, for example, in which the coating solution is coated on the surface of the light-sensitive printing plate to form the coating layer, which is then mechanically coarsened to obtain the coating layer as described above, can be used.

In more detail, a method in which a coating layer removable by a developer as earlier described is provided on the surface of the light-sensitive printing plate, and the coating layer so provided is pressed with a sheet with a smooth surface such as paper, cloth, a plastic film, or the like with fine particles having higher hardness than that of the above coating layer provided on the surface thereof, by means of a pressure roller to mat the surface of the coating layer, can be used. In addition, a method can be used which comprises rolling a pressure roller with the desired coarseness on the surface of the light-sensitive printing plate.

The coating layer provided on the surface of the light-sensitive printing plate is, as described above, dissolved in the developer and removed, or peeled off, from the light-sensiive layer in a developer. In any case, since the coating layer is removed at the time of development, the provision of the coating layer has no influence at the time of printing.

Figure 3:
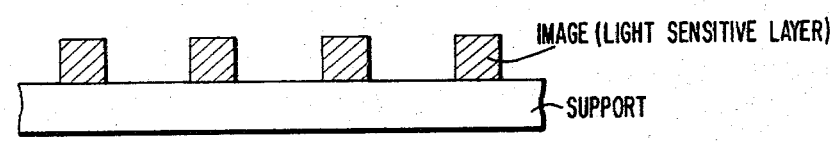
FIG. 3 is a sectional view of a light-sensitive printing plate in accordance with the present invention after exposure and development.

FIG. 3 shows a sectional view of a light-sensitive printing plate with the section shown in FIG. 2, after exposure and development, in which only the image is left on the support and the coating layer is completely removed.

Figure 4:
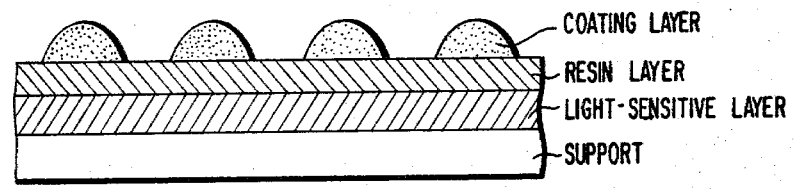
FIG. 4 is a sectional view showing an embodiment of a light-sensitive printing plate in accordance with the present invention.

FIG. 4 schematically shows a sectional view illustrating another embodiment of the light-sensitive printing plate of the present invention, in which a resin layer, through which the developer permeates and which is not dissolved by the developer, is provided on the light-sensitive layer, and a coating layer comprising a fine pattern, in which coated areas and uncoated areas exist, is provided on the resin layer as provided above.

Figure 5:
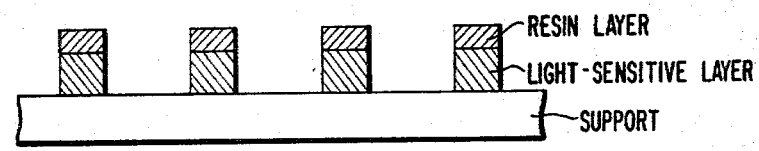
FIG. 5 is a sectional view of a light-sensitive printing plate in accordance with the present invention after exposure and development.

FIG. 5 schematically shows a sectional view of the light-sensitive printing plate shown in FIG. 4 after exposure and development, in which any one of the coated areas and the uncoated areas of the light-sensitive layer, and the resin layer provided thereon alone remains as the image, and the coating layer is completely removed, i.e. This invention can be applied to either nega-posi type or posi-nega type light-sensitive material since the light-sensitive layer at exposed areas or unexposed areas with resin layer thereon can remain to form an image and the rest are completely removed.

It should be obvious from the above explanation that in accordance with the present invention since a coating layer comprising a fine uneven pattern of coated areas and uncoated areas is provided on the surface of a light-sensitive printing plate, it is possible to bring an original into intimate contact with the light-sensitive printing plate by the vacuum adhesion method in a short period of time, thereby markedly reducing the time required for the adhesion step, and to prevent the formation of blurred images due to insufficient adhesion, and thus the efficiency of the print making step can be increased.

It is to be noted that the coating method of the present invention is not limited to the above described embodiments, and various changes and modifications can be made within the scope of the appended claims. For instance, the support is not limited to a web, and sheet-like supports cut to the desired length can also be used.

The present invention will now be illustrated in more detail by reference to the following examples. All percents are by weight unless otherwise indicated.

EXAMPLE 1

A 150 mm wide and 180μ thick aluminum web was subjected to a desmutting treatment by dipping in a 10% solution of sodium triphosphate in water at 80° C. for 3 minutes, washing with water, and dipping in 70% nitric acid at 25° C. for 1 minute. After water washing, the aluminum plate was dipped in a 2% solution of potassium fluorozirconate in water at 80° C. for 3 minutes, washed with water, and dried. On this aluminum plate there was a coating solution having the composition shown in Table 1 which was then dried to provide a light-sensitive layer. The coating amount was 0.5 g/m² (dry weight) after drying. Onto this light-sensitive layer was coated a coating solution having the composition and physical properties as shown in Table 2 by means of the coating apparatus shown in FIG. 8 at a coating speed of 20 m/min to provide a coating amount in the dry state of 0.15 g/m². Thus, a coating layer wih the sectional view shown in FIG. 1 was obtained. In this example, and in all examples, unless otherwise indicated, the coating layer was provided so as to have the characteristics as described in Example 3, i.e., the height of the coated portions was 5μ, the diameter of the coated portions was 22μ, the distance between coated portions was 100μ and the shape of the coated portions was cylindrical.

A gravure roll made of metal and of a diameter of 200 mm having a 130 mesh uneven pattern of the pyramid type (i.e., as shown in FIG. 10), on the surface of which hard chromium plating was applied, a coating roll made of silicon rubber having a hardness of 70° and a diameter of 200 mm and having a 60 mesh uneven pattern of the pyramid type, and a back-up roll made of metal and of a diameter of 100 mm were used. The pressure of the steel doctor blade on the gravure roll was 100 Kg/m and the nip pressure between the gravure roll and the coating roll and between the coating roll and the back-up roll were set to 80 Kg/m and 10 Kg/m, respectively.

After drying, the web was cut to desired lengths.

TABLE 1

| | |
|---|---|
| 2-Diazo-1-naphthol-5-sulfonic Acid Ester of Polyhydroxyphenyl (described in U.S. Pat. No. 3,635,709) | 5 parts by weight |
| Cyclohexane | 80 parts by weight |

TABLE 2

| | |
|---|---|
| Gum Arabic | 5 parts by weight |
| Silicon Dioxide (6 to 7 μ) | 2 parts by weight |
| Water | 93 parts by weight |
| Viscosity | 200 cps (25° C.) |
| Specific Gravity | 1.0 (25° C.) |

As one skilled in the art will appreciate, it is possible to coat onto an aluminum web, for instance, and dry the coating by the process of the present invention. Typically, the thus obtained web will then be cut into several plates, each of the desired dimension. In the following examples where a plurality of samples are referred to, such cutting was performed (see, for instance, Example 3).

EXAMPLE 2

Onto a 100 mm × 100 mm × 0.24 mm aluminum plate having coated thereon the same light-sensitive layer as in Example 1 at the same thickness provided thereon there was coated a coating solution having the composition and physical properties as shown in Table 2 by means of the same apparatus as was used in Example 1 (the same apparatus was used in all of the following Examples, unless modified as explained in each Example). The same coating amount, coating speed, and apparatus as were used in Example 3 were used.

After coating followed by drying, the coating layers obtained in Examples 1 and 2 were examined, and it was found that coating layers having the same uneven pattern as the surface pattern of the coating roll were obtained, and that the light-sensitive layer was free from damage.

The time required to bring these light-sensitive printing plates into intimate contact with an original by the vacuum adhesion methol was reduced to ⅓ to ¼ of that of a light-sensitive printing plate with no uneven pattern provided thereon.

EXAMPLE 3

A 0.3 mm thick aluminum plate was subjected to a desmutting treatment by dipping in a 10% solution of sodium triphosphate in water maintained at 80° C. for 3 minutes, washing with water, and then dipping in 70% nitric acid for 1 minute (25° C.). After washing, the aluminum plate was dipped in a 2% solution of potassium fluorozirconate in water at 80° C. for 3 minutes, washed with water, and dried. Onto this aluminum plate there was coated a solution having the following composition which was then dried to form a light-sensitive layer. The coating amount was 500 mg/m², dry weight after drying.

| Ingredients | Amount (g) |
| --- | --- |
| 2-Diazo-1-naphthol-5-sulfonic Acid Ester of Polyhydroxyphenyl (described in Example 1 of U.S. Pat. No. 3,635,709) | 5 |
| Cyclohexane | 80 |

Onto this light-sensitive layer was coated a solution having the following composition in an amount of 0.3 g/m², dry after drying, and dried.

| Ingredients | Amount (g) |
| --- | --- |
| Water | 100 |
| Metorase 60 SH-50 (hydroxypropyl-methyl Cellulose produced by Shinetsu Chemical Industrial Co., Ltd; hydroxypropoxylation: 7–12 mole %; methoxylation: 28–30 mole %) | 5 |
| Syloid-266 (SiO₂, average particle diameter: 27; produced by Fuji-Davison Chemical Co., Ltd. | 2 |

A coating layer was provided in such a manner that the height of the coated portions was 5μ, the diameter of the coated portions was 20μ, the distance between coated portions was 100μ, and the shape of the coated portions was cylindrical.

The time required to bring the light-sensitive printing plate into intimate contact with an original by vacuum adhesion was 15 to 20 seconds; when the coating layer was not provided, it took 60 seconds or more.

Thus, it can be understood that the use of the light-sensitive printing plate of the present invention markedly reduced the time required for bringing the plate into intimate contact with an original.

The light-sensitive lithographic printing plate was exposed to light for 2 minutes with a 35 ampere carbon arc lamp at a distance of 70 cm, and developed by dipping in a 5% solution of sodium triphosphate in water for 1 minute (25° C.) and by gently rubbing the surface thereof with absorbent cotton (developments as are disclosed in U.S. Pat. No. 3,635,709 can be used). The layer of hydroxypropylmethyl cellulose was completely dissolved and removed over the whole surface of the plate, and, furthermore, exposed areas of the light-sensitive layer were removed, whereby a positive image corresponding to the original was obtained. The printing plate showed equal printing properties. That is no influence of the coating layer on the printing properties of the light-sensitive printing plate was detected.

EXAMPLE 4

The procedure of Example 3 was repeated except that a solution having the following composition was coated on the light-sensitive layer in a dry coating amount of 0.15 g/m² and dried to provide a coating layer.

| Ingredients | Amount (g) |
| --- | --- |
| Water | 100 |
| Metorase SM-15 (Methyl Cellulose produced by Shinetsu Chemical Industrial Co., Ltd.; methoxylation: 27.5–31.5 mole %) | 5 |
| Syloid-162 (SiO₂; average particle diameter: 10 p; produced by Fuji-Davison Chemical Co., Ltd.) | 2 |

The coating layer was provided in such a manner that the height of the coated portions was 20μ, the diameter of the coated portions was 1,000μ, the distance between the coated portions was 10,000μ, and the shape of the coated portions was cylindrical.

The time required to bring this light-sensitive printing plate into intimate contact with an original by the vacuum adhesion was 20 to 30 seconds.

Form this light-sensitive lithographic printing plate was produced a printing plate in the same manner as in Example 3, and its printing properties were measured. The same results as in Example 3 were obtained.

EXAMPLE 5

The procedure of Example 3 was repeated except that a solution having the following composition was coated on the light-sensitive layer in a dry coating amount of 0.30 g/m² and dried to provide a coating layer.

| Ingredients | Amount (g) |
| --- | --- |
| Water | 100 |
| Polyvinyl Alcohol (average molecular weight 15,000) | 25 |
| Powdery Phenol Resin (novolak-type phenol resin powders; average molecular weight 3,000–8,000; average particle diameter: 20μ) | 5 |

The coating layer was provided in such a manner that the height and diameter of the coated portions were 30 and 500μ, respectively, the distance between the coated portions was 2,000μ, and the shape of the coated portions was cylindrical.

The time required to bring this light-sensitive lithographic printing plate into intimate contact with an original by vacuum adhesion was 8 to 10 seconds.

From this light-sensitive lithographic printing plate there was produced a printing plate in the same manner as in Example 3, and its printing properties were measured. The same results as in Example 3 were obtained.

EXAMPLE 6

The procedure of Example 3 was repeated except that a solution having the following composition was coated on the light-sensitive layer in a dry coating amount of 0.05 g/m² and dried to provide a coating layer.

| Ingredients | Amount (g) |
| --- | --- |
| Water | 100 |
| Polyvinyl Pyrrolidone (average molecular weight 60,000) | 20 |
| Polymethylmethacrylate Resin (prepared by pulverizing a commercially available resin; average particle diameter 30μ average molecular weight 10,000) | 5 |

The coating layer was provided in such a manner that the height and diameter of the coated portions were 40μ and 300μ, respectively, the distance between the coated portions was 3,000μ, and the shape of the coated portions was cylindrical.

The time required to bring this light-sensitive lithographic printing plate into intimate contact with an originaly vacuum adhesion was 10 to 12 seconds.

From this light-sensitive lithographic printing plate there was produced a printing plate in the same manner as used in Example 3, and its printing properties were measured. The same results as in Example 3 were obtained.

EXAMPLE 7

A 0.3 mm thick aluminum plate was degreased by dipping in a 10% solution of sodium triphosphate in water maintained at 80° C. for 1 minute, and after water-washing, it was sand-grained in a conventional manner by brushing with a nylon brush while flowing a solution prepared by dispersing pumice in water thereover. After being washed with water, the aluminum plate was dipped in a 5% solution of JIS No. 3 sodium silicate ($SiO_2/Na_2O$ (molar ratio)=3.1 to 3.3) in water maintained at 75° C. for 3 minutes. The aluminum plate was then washed with water and dried. Then, on the aluminum plate there was coated a solution having the following composition in a dry weight of 1 g/m² and dried to provide a light-sensitive layer.

| Ingredients | Amount (g) |
|---|---|
| Shellac | 10 |
| Polyvinyl Acetate (average molecular weight: 60,000–100,000) | 1 |
| Condensation Product of Hexafluorophosphate of 4-Diazo-4″-methoxyphenylamine and Formaldehyde (ca. equimolar; condensation degree, ca. 3–6 ratio) | 3 |
| Methylene Blue | 0.3 |
| Methanol | 200 |
| Furfuryl Alcohol | 50 |

Onto this light-sensitive layer then was coated a solution having the following composition in a dry weight of 0.05 g/m² which was then dried.

| Ingredients | Amount (g) |
|---|---|
| Water | 100 |
| Enzyme modified Starch | 10 |

The coating layer was provided in such a manner that the height and diameter of the coated portions were 3μ and 50μ, respectively, the distance between the coated portions was 500μ, and the shape of the coated portions was cylindrical.

The time required to bring this light-sensitive lithographic printing plate into intimate contact with an original by vacuum adhesion was 30 to 40 seconds. On the other hand, when such a coating layer was not provided, it took 60 seconds or more.

The light-sensitive lithographic printing plate brought into intimate contact with the above original was exposed to light with a 30 ampere carbon arc lamp at a distance of 70 cm for 2 minutes. This plate was then developed by dipping in a developer having the following composition at 20° C. for 1 minute and rubbing with soft cloth. The coating layer was completely removed, and, furthermore, unexposed areas of the light-sensitive layer were completely removed. Thus a printing plate was obtained. There was no difference in capability between this printing plate and the one obtained from a light-sensitive printing plate with no coating layer.

| Ingredients | Amount (g) |
|---|---|
| Methanol | 10 |
| Water | 80 |
| Sodium Hydroxide | 1 |

EXAMPLE 8

Onto the aluminum plate used in Example 3 which had been subjected to the surface treatment as in Example 1 there was coated a solution having the following composition in a dry weight of 0.12 g/m² and dried to provide a light-sensitive layer.

| Ingredients | Amount (g) |
|---|---|
| p-Toluenesulfonate of Condensation Product of p-Diazodiphenylamine and Formaldehyde | 1 |
| Ethylene dichloride (ca. equimolar ratio; condensation degree, ca. 3–6) | 100 |
| Methanol | 100 |

Onto this light-sensitive layer was coated a solution having the following composition.

| Ingredients | Amount (g) |
|---|---|
| Polyvinyl Formal (average molecular weight ca. 100,000) | 4 |
| Phthalocyanine Blue | 1 |
| Ethylene dichloride | 500 |
| Monochlorobenzene | 20 |

The total weight of the above prepared layer and the light-sensitive layer after drying was 0.31 g/m². Onto this layer was coated a solution of the followig composition and dried.

| Ingredients | Amount (g) |
|---|---|
| Water | 100 |
| Hydroxypropylmethyl Cellulose (the same as was used in Example 3) | 15 |
| Syloid-161 ($SiO_2$, average particle size 7μ, produced by Fuji-Davison Chemical Co., Ltd.) | 5 |

In this case, the height and diameter of the coated portions were 10μ and 4,000μ respectively, the distance between the coated portions was 30,000μ, the shape of the coated portion was cylindrical, and the coated amount (as dry weight) was 0.15 g/m².

The thus obtained light-sensitive lithographic printing plate could be brought into intimate contact with an original by vacuum adhesion in 20 to 30 seconds. On the other hand, with a light-sensitive printing plate in which no coating layer was provided, it took 60 to 70 seconds to bring it into intimate contact with the original.

The light-sensitive printing plate brought into intimate contact with the original was exposed to light with a 35 ampere carbon arc lamp at a distance of 70 cm for 1 minute, and then developed by dipping in a developer consisting of isopropyl alcohol/water=2:1 (volume ratio) at 20° C. for 1 minute and by gently rubbing the surface with absorbent cotton. The coating layer was removed all over the plate, and, furthermore, unexposed areas of the light-sensitive layer and the polyvinyl formal layer thereon were completely removed. On the other hand, exposed areas of the light-sensitive layer and the polyvinyl formal layer thereon remained without being damaged.

This printing plate provided 50,000 or more sheets of good quality prints, and it showed the same performance as the printing plate produced from the light-sensitive printing plate with no coating layer provided thereon.

EXAMPLE 9

To 53 g (0.5 mole) of diethylene glycol was added 197 g (1.05 mole) of xylylene diisocyanate, which were then reacted at 80° C. for 2 hours at atmospheric pressure. To the resulting mixture were added 390 g (1.0 mole) of hydroxyethyl tetrahydrophthalyl acrylate (OH value 146; average molecular weight 390) represented by the formula:

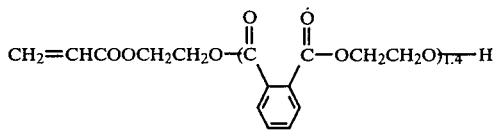

and 0.30 g of 2,6-di-t-butylcresol as a polymerization inhibitor, which were then reacted at 80° C. for 8 hours at atmospheric pressure while blowing air therethrough to produce a divinyl urethane compound having a residual isocyanate value of 4.8.

This divinylurethane compound in the amount of 60 parts, 40 parts of cellulose acetate hydrogen phthalate, CAP (trade name, produced by Wako Pure Chemical Industries, Ltd.) phthalic acid content 32% by weight), 1 part of benzoin ethyl ether as a sensitizing agent, 0.05 parts of 4,4-thiobis(3-methyl-6-t-butylphenol) as a heat polymerization inhibitor, and 0.025 parts of Methylene Blue were dissolved in 40 parts of acetone and 30 parts of methanol as solvents, and the resulting solution was allowed to stand at 40° C. for one day and night to effect defoaming. The thus deformed solution was coated on a 0.3 mm thick sand-grained aluminum plate and dried to provide a light-sensitive layer of a film thickness of 0.6 mm. Onto this light-sensitive layer was coated a solution having the following composition to provide a dry weight of 1.5 g/m², and dried.

| Ingredients | Amount (g) |
|---|---|
| Water | 100 |
| Polyvinyl Pyrrolidone (average molecular weight: 10,000–100,000) | 15 |

In this case, the height and diameter of the coated portions were 3μ and 100μ, respectively, the distance between the coated portions was 1,000μ, the shape of the coated portion was cylindrical, and the coating amount as (dry weight) was 0.08 g/m².

This light-sensitive lithographic printing plate could be brought into intimate contact with an original by vacuum adhesion in 30 to 40 seconds. The light-sensitive lithographic printing plate so contacted with the original was exposed to light with a printer in which 20 watt chemical lamps (FL-20 BL produced by Tokyo Shibaura Electric Co., Ltd.) were arranged at 6 cm intervals, for 10 minutes. The printing plate was developed by dipping in a developer having the following composition at 30° C. for 1–3 minutes and thereafter gently rubbing the surface with absorbant cotton.

| Ingredients | Amount (g) |
|---|---|
| Isopropanol | 0.5 |
| Sodium Hydroxide | 0.2 |
| Water | 100 |

The coating layer was removed all over the plate, and, moreover, the unexposed areas of the light-sensitive layer were removed. Thus, a good quality printing plate was obtained.

The following novel effects can thus be attained by the present invention. (1) Since a coating layer comprising an uneven pattern can be provided with ease on the surface of a light-sensitive printing plate, it is possible to bring an original into intimate contact with a light-sensitive printing plate by the vacuum adhesion method in a short period of time, thereby enabling one to markedly shorten the adhesion step, and, at the same time, it is possible to prevent the formation of blurred images based on incomplete adhesion. (2) Since the coating layer with the uneven pattern is provided on the surface of the light-sensitive printing plate, the light-sensitive layer is free from the possibility of damage in the case that light-sensitive printing plates are superposed upon each other, and, moreover, the problems do not occur that the light-sensitive printing plates come into intimate contact with each other and can be handled only with difficulty. (3) Since the coating layer is provided on the surface of the light-sensitive printing plate by means of a coating roll made of elastic rubber and with an uneven pattern thereon, the light-sensitive layer is not damaged. (4) Since a gravure roll is used as an applicator roll, and the coating solution is once transferred onto the coating roll with the uneven pattern on the surface thereof by the gravure roll and then transferred to a support, it is possible to provide a coating layer with the same uneven pattern as the surface pattern of the coating roll on the support without severe doctoring conditions by means of a doctor blade at the gravure roll.

While the invention has been described in detail and with reference to specific embodiments thereof, it will be apparent to one skilled in the art that various changes and modifications can be made therein without departing from the spirit and scope thereof.

What is claimed is:

1. A process for producing a light sensitive printing plate with a coating layer removable at the time of development provided on the surface thereof which comprises taking up a coating solution with a gravure roll, scraping away excess coating solution attached to the gravure roll by means of a doctor blade, transferring the coating solution to a coating roll made of an elastic material with a fine uneven pattern on the surface thereof and turning in the same direction and at the same speed as the gravure roll, and transferring the coating solution transferred to the coating roll to a support running at the same speed and in the same direction as the coating roll said support having a light sensitive layer and said deposited coating produces an uneven pattern of a discontinuous coating layer consisting of coated areas and uncoated areas, the height of the coated areas being about 2 to 40 microns, and the distance between the coated areas adjacent to each other is about 50 to 100,000 microns.

2. The process according to claim 1, wherein the gravure roll has a fine uneven regular pattern on the surface thereof.

3. The process according to claim 1, wherein the surface pattern of the coating roll is larger than that of the gravure roll.

4. The process according to claim 2, wherein the uneven pattern of the gravure roll has a size of about 30 to about 200 mesh.

5. The process according to claim 3, wherein the uneven pattern of the coating roll has a size of about 10 to about 60 mesh.

6. The process according to claim 1, wherein the nip pressure between the gravure roll and the coating roll is about 10 to about 200 Kg/m.

7. The process according to claim 1, wherein nip pressure is maintained between the coating roll and the support by means of a back-up roll and wherein the nip pressure between the coating roll and the back-up roll is about 1 to about 20 Kg/m.

8. The process according to claim 1, wherein the amount of the coating solution coated on the surface of the light sensitive printing plate is about 0.05 to about 2 $g/m^2$ by weight after drying.

* * * * *